United States Patent
Nagai et al.

(10) Patent No.: US 8,804,882 B2
(45) Date of Patent: Aug. 12, 2014

(54) RECEIVING APPARATUS, AND COMPUTER READABLE MEMORY MEDIUM THAT STORES A PROGRAM

(75) Inventors: Hiromune Nagai, Iruma (JP); Shinpei Matsuda, Tachikawa (JP); Hiroji Akahori, Hachioji (JP)

(73) Assignees: Casio Computer Co., Ltd., Tokyo (JP); Oki Semiconductor Co., Ltd., Hachioji-shi (JP)

( * ) Notice: Subject to any disclaimer, the term of this patent is extended or adjusted under 35 U.S.C. 154(b) by 486 days.

(21) Appl. No.: 13/087,577

(22) Filed: Apr. 15, 2011

(65) Prior Publication Data

US 2011/0255642 A1  Oct. 20, 2011

(30) Foreign Application Priority Data

Apr. 19, 2010  (JP) .................................. 2010-095720

(51) Int. Cl.
 *H04L 27/08* (2006.01)
(52) U.S. Cl.
 USPC ........................................................ 375/345
(58) Field of Classification Search
 USPC ........................................................ 375/345
 See application file for complete search history.

(56) References Cited

U.S. PATENT DOCUMENTS

| | | | |
|---|---|---|---|
| 2005/0147192 A1* | 7/2005 | Yamamoto et al. | 375/345 |
| 2007/0049228 A1* | 3/2007 | Fujishima et al. | 455/253.2 |
| 2009/0298448 A1* | 12/2009 | Mayer et al. | 455/127.2 |
| 2009/0310723 A1 | 12/2009 | Ishiguro | |

FOREIGN PATENT DOCUMENTS

| | | |
|---|---|---|
| CN | 1553582 A | 12/2004 |
| CN | 101479947 A | 7/2009 |
| EP | 1763150 A1 | 3/2007 |
| JP | 2002-290178 A | 10/2002 |
| JP | 2007-019900 A | 1/2007 |

OTHER PUBLICATIONS

Chinese Office Action dated May 21, 2013 (and English translation thereof) in counterpart Chinese Application No. 201110102501.7.

* cited by examiner

*Primary Examiner* — Kabir A Timory
(74) *Attorney, Agent, or Firm* — Holtz Holtz Goodman & Chick PC

(57) ABSTRACT

Suitable gain control is achieved at low cost.
In a receiving apparatus, an RF signal that is amplified by an RF amp is converted to an IF frequency by a frequency conversion unit and amplified by an IF amp, then the output signal from the IF amp that was converted to a digital signal by an ADC is inputted to a digital processing unit. The output from the ADC is then filtered to a desired frequency by a digital filter and inputted to the digital processing unit. In the digital processing unit the signal power before filtering by the digital filter and the signal power after filtering by the digital filter are measured, and the power difference is calculated. Based on the power difference, which indicates the ratio of unnecessary power, the digital processing unit controls the gain ratio of the RF amp and IF amp.

10 Claims, 7 Drawing Sheets

US 8,804,882 B2

RECEIVING APPARATUS, AND COMPUTER READABLE MEMORY MEDIUM THAT STORES A PROGRAM

CROSS-REFERENCE TO RELATED APPLICATION

This application claims the benefit of Japanese Patent Application NO. 2010-095720, filed Apr. 19, 2010, the entire disclosure of which is incorporated by reference herein.

FIELD

This application relates generally to a receiving apparatus and a computer readable memory medium that stores a program, and more particularly, to a receiving apparatus that is suitable for receiving digital broadcasts, and a computer readable memory medium that stores a program.

BACKGROUND

A receiving apparatus for receiving digital broadcasts such as terrestrial digital broadcasts performs frequency conversion and demodulation of a received high-frequency signal to a demodulated frequency. In order to keep the input signal that is inputted to a demodulating circuit in this case constant, gain control is performed as disclosed in Unexamined Japanese Patent Application KOKAI publication No. 2002-290178.

In the case of the receiving apparatus for digital broadcasts, a received analog signal is converted to a digital signal by an ADC (Analog-Digital Converter) to perform demodulation operation; however, operation associated with the gain control is generally performed in an analog circuit before the digital conversion.

In this kind of conventional receiving apparatus, gain control of an IF (Intermediate Frequency) amp, which amplifies using the output frequency that is inputted to a demodulator, amplifies a signal that has been narrowed to the necessary frequency band by a filter. Therefore, by finding the output power of the IF amp, a gain controller in a demodulator can perform suitable gain control. On the other hand, an RF (Radio Frequency) amp performs lumped amplification of a broadcast frequency band, so broadcast signals (unnecessary signals) other than the desired broadcast channel (desired signal) are also amplified. When the gain of an RF amp is excessively high, the output signal becomes saturated and distorted, so by matching the gain of the RF amp with the desired signal, the gain becomes excessive for the unnecessary signal, and the output signal become distorted.

Therefore, in a conventional receiving apparatus, by performing power detection at a stage before the filter, and controlling the gain by using the power of the entire broadcast frequency band and not just that of the desired signal, distortion in the RF amp is avoided. Therefore, in order to perform gain control of an RF amp, a conventional receiving apparatus had to have analog circuits such as a power detector and gain controller.

Here, in order to make a conventional receiving apparatus low cost and compact, a silicon tuner IC is often used. In a silicon tuner IC, the characteristics in the guaranteed temperature range desired for the receiving apparatus change. A silicon tuner IC that is achieved by integrating analog circuits absorbs changes in performance that accompany changes in temperature, so a circuit for assuring the temperature is also necessary. Also, in some cases, there are parts that do not fit within the assured temperature range.

SUMMARY

A receiving apparatus of a first aspect of the present invention is a receiving apparatus comprising at least: a first amplifier that amplifies a received wave using high frequency; a frequency converter that performs frequency conversion from the frequency band of the first amplifier to a frequency band at a later stage; an analog filter that filters the signal that has been subjected to frequency conversion by the frequency converter; a second amplifier that amplifies the signal, which was filtered by the analog filter, using a demodulation frequency; a converter that converts the output signal from the second amplifier to a digital signal; a digital filter that filters the digital signal to a desired frequency band; and a demodulator that demodulates the signal that was filtered by the digital filter; and further comprising a digital circuit to which the output signal from the converter and the signal that is filtered by the digital filter are inputted; wherein the digital circuit comprises: a power difference calculation unit that calculates the power difference between the digital signal from the converter and the digital signal that was filtered by the digital filter; and a gain control unit that, based on at least the power difference that was calculated by the power difference calculation unit, controls the gain ratio of the first amplifier and the second amplifier.

A computer readable memory medium of a second aspect of the present invention is a computer readable memory medium on which a program is recorded that cause a computer, which controls a receiving apparatus that comprises at least: a first amplifier that amplifies a received wave using high frequency; a frequency converter that performs frequency conversion from the frequency band of the first amplifier to a frequency band at a later stage; an analog filter that filters the signal that has been subjected to frequency conversion by the frequency converter; a second amplifier that amplifies the signal, which was filtered by the analog filter, using a demodulation frequency; a converter that converts the output signal from the second amplifier to a digital signal; a digital filter that filters the digital signal to a desired frequency band; and a demodulator that demodulates the signal that was filtered by the digital filter; to achieve: a function of calculating the power difference between the digital signal from the converter and the digital signal that was filtered by the digital filter; and a function that, based on at least the power difference that was calculated by the power difference calculation unit, controls the gain ratio of the first amplifier and the second amplifier.

With the present invention, it is possible to achieve a receiving apparatus at low cost that is capable of performing suitable gain control.

The above and further object and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

A more complete understanding of this application can be obtained when the following detailed description is considered in conjunction with the following drawings, in which.

DETAILED DESCRIPTION

The preferred embodiments of the present invention will be explained below with reference to the drawings.

Embodiment 1

Figure 1:
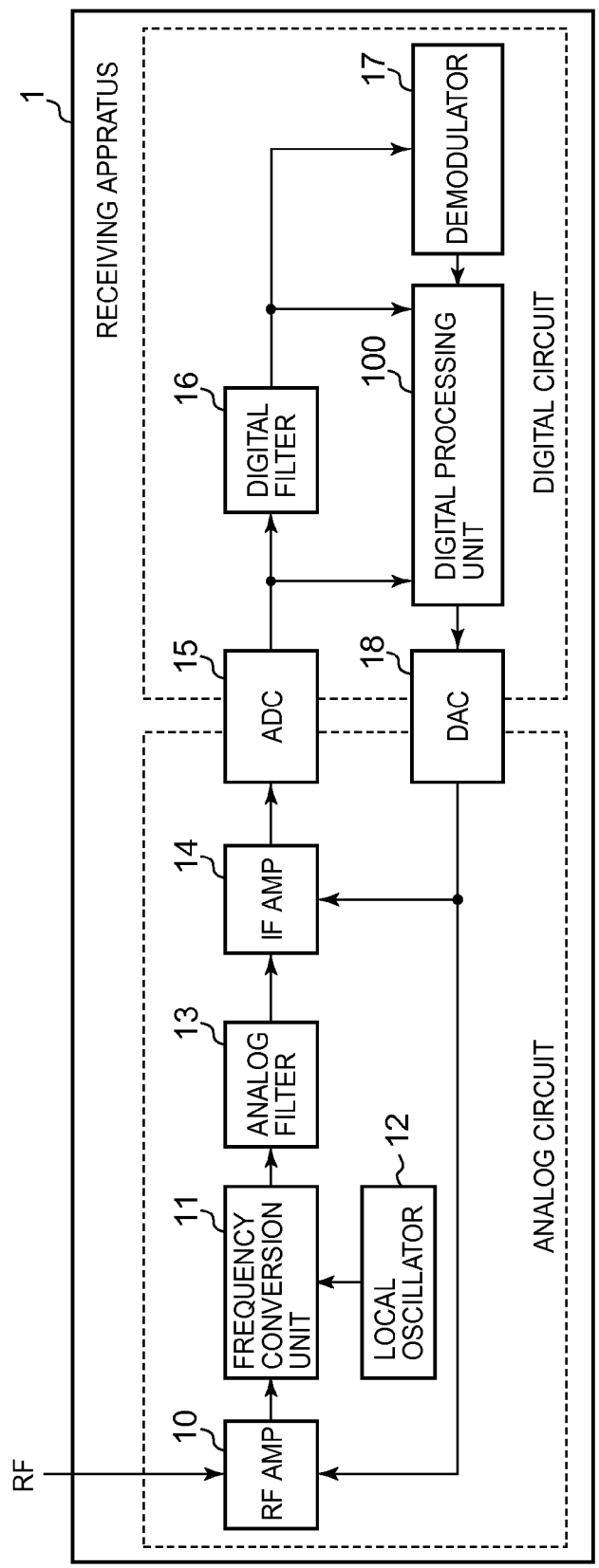
FIG. 1 is a block diagram illustrating the construction of a receiving apparatus of a first embodiment of the present invention.

The receiving apparatus 1 of a first embodiment of the present invention will be explained with reference to FIG. 1. In this embodiment, the receiving apparatus of the present invention is explained using an example in which the receiving apparatus is constructed in order to be used for receiving digital broadcasts such as terrestrial digital broadcasts. FIG. 1 is a block diagram illustrating the construction of the receiving apparatus 1 of this first embodiment.

As illustrated in FIG. 1, the receiving apparatus 1 of this embodiment comprises an RF amp 10, a frequency conversion unit 11, a local oscillator 12, an analog filter 13, an IF amp 14, an ADC 15, a digital filter 16, a demodulator 17, a DAC 18 and a digital processing unit 100.

The RF amp 10 is an amplifier (first amplifier) that uses the broadcast frequency (RF: Radio Frequency) to amplify a received signal of a broadcast signal that was received by an antenna (not illustrated in the figure) or the like, and in this embodiment, this RF amp 10 is a variable gain amplifier (VGA), the gain of which can be controlled.

The frequency conversion unit 11 comprises a mixing circuit such as an analog multiplier, and by mixing the frequency of the signal amplified by the RF amp 10 with the local frequency from the local oscillator 12, converts the output frequency of the RF amp 10 from the RF band to a later stage frequency band. In this embodiment, the frequency conversion unit 11 performs frequency conversion from the RF band to the IF (Intermediate Frequency) band.

The analog filter 13 is an analog filter such as a low pass filter (LPF), and attenuates any unnecessary waves by filtering the output signal from the frequency conversion unit 11.

The IF amp 14 is an amplifier (second amplifier) that comprises a VGA (variable gain amplifier) similar to that of the RF amp 10, and amplifies the signal filtered by the analog filter 13 using the frequency outputted to the demodulator 17. In this embodiment, the signal filtered by the analog filter 13 is converted by the frequency conversion unit 11 to the IF frequency band, so the IF amp 14 amplifies using an IF band frequency.

The ADC 15 is an analog-digital converter (ADC), and converts the IF band analog signal that was amplified by the IF amp 14 to a digital signal, and provides that signal to the digital signal process for demodulation.

The digital filter 16 is a digital filter that filters the digital signal, which was converted by the ADC 15, to the desired frequency band, and comprises a DLPF (Digital Low-Pass Filter) for example.

The demodulator 17 comprises a digital demodulating circuit that demodulates the digital signal that was filtered by the digital filter 16 to the desired frequency band, and outputs an output signal that expresses audio or video to a reproduction operation at a later stage (not illustrated in the figure).

The DAC 18 is a digital-analog converter (DAC), and converts the control signal (digital signal), which was generated by the digital processing unit 100 when the digital processing unit 100 controlled the analog circuits before the ADC 15, to an analog signal. When generating an analog control signal such as this, modulation such as PWM (Pulse Width Modulation) or PCM (Pulse Code Modulation) is performed as necessary.

The digital processing unit 100 comprises a digital processor (digital processing circuit) such as a DSP (Digital Signal Processor) or CPU (Central Processing unit), and performs processing using the digital signal that was converted by the ADC 15. In this case, the function of the demodulator 17 described above is achieved by this digital processing unit 100.

In this embodiment, as illustrated in FIG. 1, the output from the ADC 15 and the output from the digital filter 16 are inputted to the digital processing unit 100. The digital processing unit 100, for example, achieves various functions by executing operation programs that are stored in a register, ROM (Read Only Memory) or other rewritable memory device.

Figure 2:
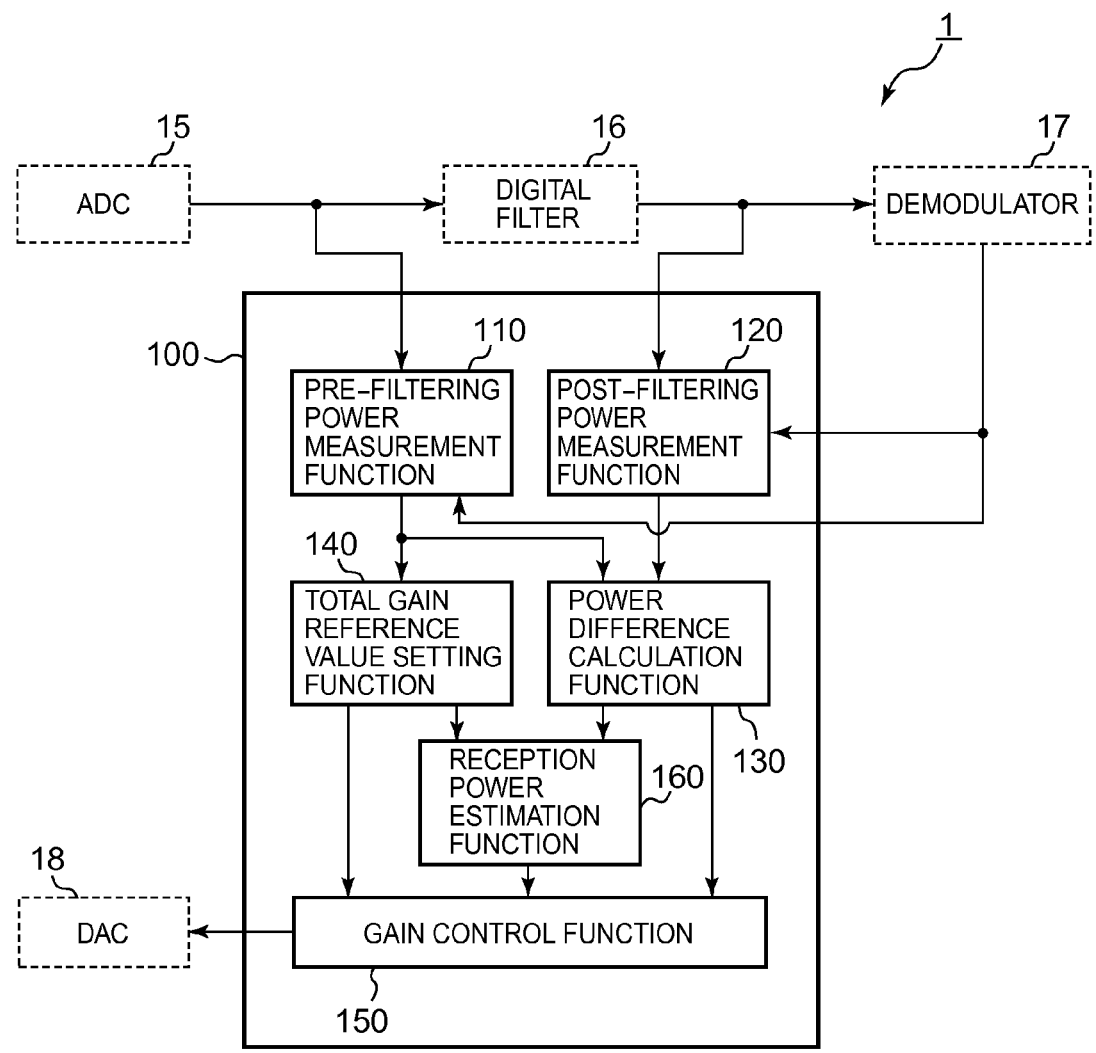
FIG. 2 is a block diagram of the functions achieved by the digital processing unit illustrated in FIG. 1.

In this embodiment, the digital processing unit 100 performs gain control of the RF amp 10 and IF amp 14. Of the functions achieved by the digital processing unit 100, the functions that are necessary for gain control are explained below with reference to FIG. 2. FIG. 2 is a block diagram of the functions achieved by the digital processing unit 100.

As illustrated in FIG. 2, the digital processing unit 100 achieves functions such as a pre-filtering power measurement function 110, post-filtering power measurement function 120, power difference calculation function 130, total gain reference value setting function 140, gain control function 150 and reception power estimation function 160. In this embodiment, these functions are integrally achieved in a processor such as a DSP or CPU; however, these functions could also be achieved by special hardware for performing the operation of these functions.

The pre-filtering power measurement function 110 measures the signal power (hereafter, referred to as the "pre-filtering signal power") of the input signal from the ADC 15, or in other words, the digital signal before being filtered by the digital filter 16.

The post-filtering power measurement function 120 measures the signal power (hereafter, referred to as the "post-filtering signal power") of the input signal from the digital filter 16, or in other words, the digital signal after being filtered by the digital filter 16.

The output period of the pre-filtering power measurement function 110 and the post-filtering power measurement function 120 is in the modulation signal units of the modulation method for the received signal. For example, when the modulation method is OFDM (Orthogonal Frequency Division Multiplexing), the output period of the pre-filtering power measurement function 110 and the post-filtering power measurement function 120 corresponds to 1 OFDM symbol or an integral multiple thereof. When the output period is set in modulation signal units in this way, the timing signal, which is based on the demodulation operation by the demodulator 17, is inputted from the demodulator 17 to the pre-filtering power measurement function 110 and post-filtering power measurement function 120.

The method of measuring the power by the pre-filtering power measurement function 110 and post-filtering power measurement function 120 is arbitrary; for example, known technology such as a method of converting a signal to power and finding the power using the average over the interval, or a method of finding the ratio from the amplitude probability density distribution that exceeds a threshold value and performing conversion can be used.

The power difference calculation function 130 calculates the power difference between the pre-filtering signal power and the post-filtering signal power by calculating the difference between the signal power measured by the pre-filtering power measurement function 110 and post-filtering power measurement function 120.

Here, the object of reception by the receiving apparatus 1 of this embodiment is a so-called full-segment (full-seg) broadcast. In other words, the receiving apparatus 1 receives all of the frequency bands assigned to one channel (hereafter, referred to as "full band"). In the case of this kind of full-band reception, the power of the desired channel exists in all desired frequency bands, so except for the power of the desired frequency band, all of the power becomes an unnecessary frequency component.

In this embodiment, the output signal from the ADC 15 is filtered to the desired frequency band by the digital filter 16, so the frequency component of an unnecessary wave, or a distorted frequency component due to an unnecessary wave in the receiving apparatus 1 is mixed with the signal before filtering is performed by the digital filter 16. Therefore, by comparing the signal before filtering with the signal that has been filtered by the digital filter 16 to the desired frequency band, it is possible to estimate the power ratio of the unnecessary wave.

In other words, the power difference that is calculated by the power difference calculation function 130 indicates this power ratio of the unnecessary wave. Here, when the power of the desired wave that is inputted to the receiving apparatus 1 is low, unnecessary power occurs due to the effect of thermal noise. However, when the ratio of unnecessary wave power is high even when the power of the desired wave that is inputted to the receiving apparatus 1 is high enough that it is not affected by thermal noise, an unnecessary wave or distortion due to the unnecessary wave is included. In such a case, the output value that is calculated by the power difference calculation function 130 becomes large. On the other hand, when the ratio of the unnecessary wave power is low, the output value that is calculated by the power difference calculation function 130 becomes small.

The total gain reference value setting function 140, based on the pre-filtering signal power that is measured by the pre-filtering power measurement function 110, sets a reference value (total gain reference value) for setting the total of the gain of the RF amp 10 and IF amp 14 (total gain), and outputs that reference value to the gain control function 150. In this case, the total gain reference value setting function 140 compares the power value to which the power is to converge (target value) with the pre-filtering signal power. When the pre-filtering signal power is greater than the target value, the total gain reference value setting function 140 makes the output value of the total gain reference value small, and when the pre-filtering signal power is less than the target value, makes the value of the output total gain reference value large.

The total gain of the RF amp 10 and IF amp 14 that is set by the gain control function 150 in a later stage fluctuates according to the total gain reference value that is outputted by the total gain reference value setting function 140. In this embodiment the total gain becomes small as the total gain reference value increases, and becomes large as the smaller the total gain reference value decreases. In other words, feedback configuration is used when setting the total gain, and control is performed so that the value from the pre-filtering power measurement function 110 is constant.

The gain control function 150 controls the gain ratio of the RF amp 10 and IF amp 14 based mainly on the power difference that is calculated by power difference calculation function 130. In other words, the gain control function 150 controls the gain ratio by not only performing gain control of the IF amp as is normally performed in a conventional analog circuit, but by also performing gain control of the RF amp as well. In other words, the gain of the RF amp 10 and IF amp 14, which are analog circuits, is controlled by the gain control function 150, which is logically achieved by the digital processing unit 100.

As described above, the power difference that it calculated by the power difference calculation function 130 indicates the unnecessary power ratio, so the gain control function 150 performs control of the gain ratio according to the unnecessary power ratio. In this case, the gain control function 150 presumes that when the unnecessary power ratio is large, the power of the unnecessary wave or the power component due to distortion of the unnecessary wave is high, and performs control to lower the gain ratio of the RF amp 10 without changing the overall total gain of the receiving apparatus 1. On the other hand, when the unnecessary power ratio is small, the gain control function 150 performs control to increase the gain ratio of the RF amp 10 so that the noise figure (NF), which indicates the effect of the thermal noise, becomes a minimum.

More specifically, the gain control function 150 compares the reference value (comparison value) of the settable gain ratio of the RF amp 10 and the power difference that is outputted from the power difference calculation function 130, and when the value of the power difference is greater than the reference value (comparison value), generates a control signal for performing control to lower the gain ratio of the RF amp 10. On the other hand, when the value of the power difference is less than the reference value (comparison value), the gain control function 150 generates a control signal for performing control to increase the gain ratio of the RF amp 10.

In this case, the RF amp 10 is controlled for a longer period than the control period of the IF amp 14. Here, the control period of the IF amp 14 is the same as the output period of the pre-filtering power measurement function 110 and post-filtering power measurement function 120, and is in modulation signal units. In other words, in the case where the modulation method of the received wave is OFDM, the control period of the IF amp 14 is equal to 1 OFDM symbol period or an integer multiple thereof.

The gain control of the RF amp 10 is performed for a longer period than the control period of the IF amp 14. By this, switching of the gain of the RF amp 10 before the total gain converges due to the convergence of the IF amp 14 is prevented. As a result, there is no large fluctuation in the gain of the RF amp 10 during the time until the IF amp 14 converges, and thus it is possible to reduce behavior such as the total gain not converging. However, when the total gain does not converge during the control period of the RF amp 10, by subtracting the amount of change in the gain of the RF amp 10 from the gain of the IF amp 14, the total gain of the RF amp 10 and IF amp 14 is controlled so that it is constant.

The reception power estimation function 160 estimates the reception power of the desired frequency component based on the output values from the power difference calculation function 130 and total gain reference value setting function 140. In other words, for the value that is outputted from the total gain reference value setting function 140, the received power for the frequency component before filtering is reflected, and for the value that is outputted from the power difference calculation function 130, the ratio of the desired frequency component of that frequency component is reflected, so the reception power estimation function 160 can find the reception power for the desired frequency portion by calculating the reception power found from the total gain reference value as the ratio of the desired frequency component.

In other words, the reception power estimation function 160 can find the reception power of the received signal having the desired frequency (received signal power), and in the receiving apparatus 1, this value is used as a RSSI (Received Signal Strength Indicator).

The construction of the receiving apparatus 1 of this embodiment was described above, however, the construction above is the necessary construction for achieving the present invention, and other construction that is necessary for the receiving apparatus can be appropriately included as necessary.

Figure 3:
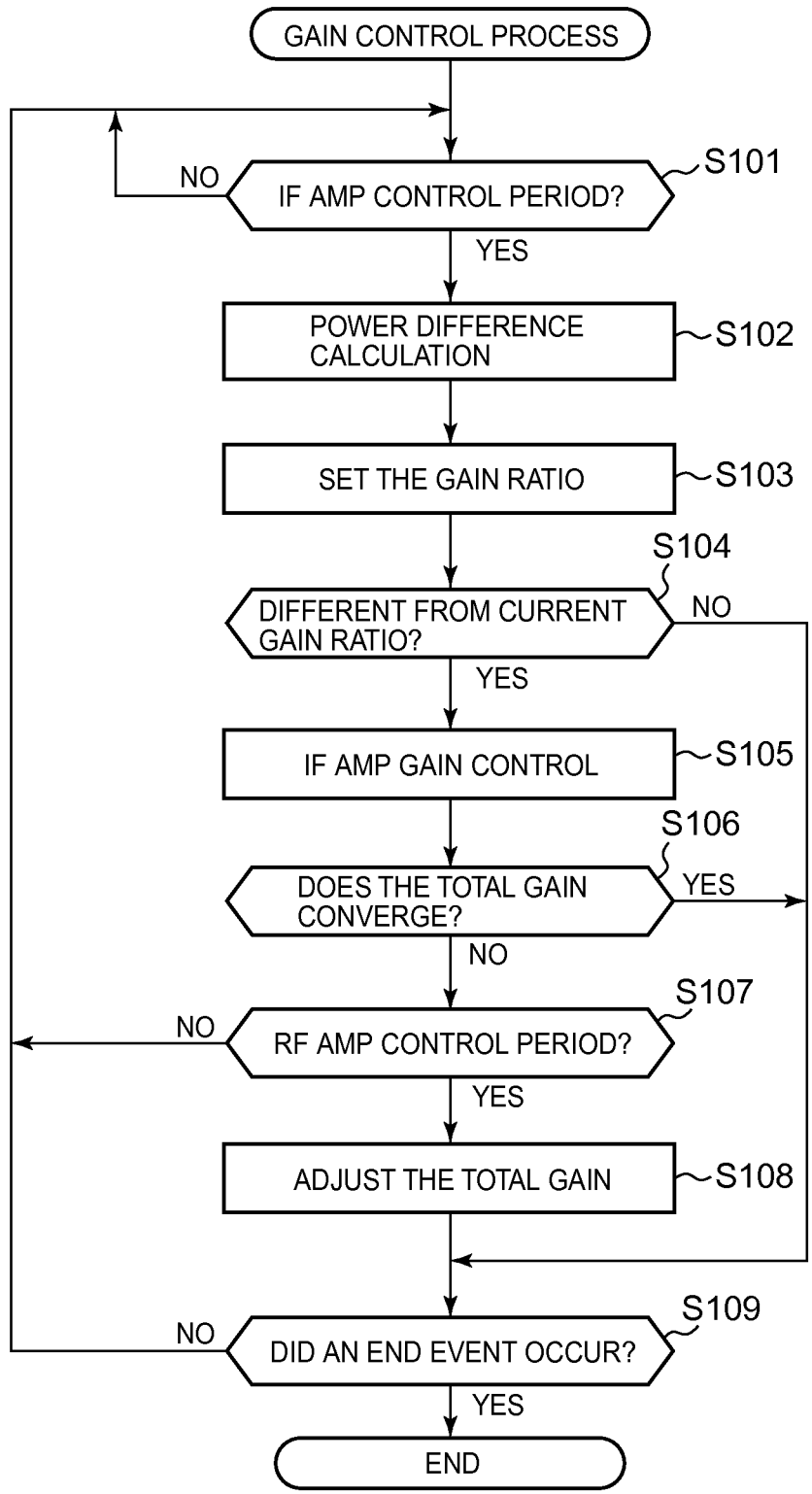
FIG. 3 is a flowchart for explaining the "gain control process" of a first embodiment of the present invention.

An example of the operation of a receiving apparatus 1 having this kind of construction is explained below. Here, the "gain control process" that is achieved by the digital processing unit 100 is explained with reference to the flowchart illustrated in FIG. 3. This "gain control process" is started by the receiving apparatus 1 of this embodiment; for example is started when the receiving operation is started.

After processing has started and it is the control period of the IF amp 14 (in other words, period in modulation signal units) (step S101: YES), the pre-filtering power measurement function 110 and post-filtering power measurement function 120 both measure the respective signal power and output the results to the power difference calculation function 130. The power difference calculation function 130 calculates the power difference between the signal power of the signal before filtering, which was measured by the pre-filtering power measurement function 110, and the signal power of the signal after filtering, which was measured by the post-filtering power measurement function 120 (step S102), and notifies the gain control function 150.

Information that indicates the signal power that was measured by the pre-filtering power measurement function 110 and the post-filtering power measurement function 120, and information that indicates the power difference that was calculated by the power difference calculation function 130 is stored in a memory device such as a register of the digital processing unit 100, or RAM (Random Access Memory) that is used by the digital processing unit 100.

At this time, the pre-filtering power measurement function 110 also notifies the total gain reference value setting function 140 of the measured signal power of the signal before filtering. The total gain reference value setting function 140 sets the total gain reference value based on the signal power of the signal before filtering, and notifies the gain control function 150.

The gain control function 150 sets the gain ratio of the RF amp 10 and IF amp 14 by comparing the power difference that was notified from the power difference calculation function 130 and the reference value for the gain ratio of the RF amp 10 and IF amp 14 (step S103). Information that indicates the total gain reference value that is set by the total gain reference value setting function 140, and information that indicates the gain ratio set by the gain control function 150 is also stored in a memory device as described above.

After setting the gain ratio, the gain control function 150 compares that set gain ratio with the current gain ratio that is stored in the memory device, and when the set gain ratio differs from the current gain ratio (step S104: YES), the gain control function 150 generates a control signal for controlling the RF amp 10 and IF amp 14 so that the current gain ratio becomes the same as the set gain ratio.

By transmitting a control signal that was generated for the IF amp 14 to the IF amp 14 via the DAC 18, the gain control function 150 controls the gain of the IF amp 14 so that the gain ratio equals the set gain ratio (step S105).

Here, it is expected that the total gain will automatically converge due to the convergence of the IF amp 14. Therefore, based on the reference value that is outputted by the total gain reference value setting function 140, the gain control function 150 determines whether or not the total gain of the RF amp 10 and IF amp 14 converge such that the gain ratio equals the set gain ratio (step S106).

In other words, it is possible to stabilize the total gain by making the control period of the RF amp 10 longer than the control period of the IF amp 14. It is explained as follows. In the case that the gain ratio is changed while keeping the total gain of the RF amp 10 and IF amp 14 constant, a change of the gain ratio causes the change of the total gain, if a difference between the set total gain and the actual total gain by the RF amp 10 and IF amp 14 occurs. In this case, the error in the total gain converges within the control period of the RF amp 10 with time, due to the convergence of the IF amp 14, since a difference between the control periods of the RF amp 10 and IF amp 14 is provided. Therefore, the total gain becomes stable, since the error in the total gain automatically converges by setting the control period of the RF amp 10 longer enough for a time amount required for the convergence of the error.

Therefore, in step S105, by controlling the gain of the IF amp 14, it is expected that the total gain will automatically converge. However, when the total gain has not converged during the time of the control period of the RF amp 10 (step S106: NO, step S107: YES), by subtracting the amount of change in the gain of the RF amp 10 from the gain of the IF amp 14, the gain control function 150 performs adjustment so that the total gain of the RF amp 10 and IF amp 14 is constant (step S108).

By repeatedly executing the operation above until a specified end event, such as the end of operation of the receiving apparatus 1, occurs, gain control is performed according to the unnecessary power included in the input signal (step S09: NO).

Also, this processing ends when an end event occurs (step S109: YES).

With this embodiment, the gain ratio of the RF amp 10 and IF amp 14 is controlled based on the power ratio from the desired frequency band component and the other component that are included in the ADC 15 output. As a result, in full-band reception, such as reception of a full-segment broadcast, it is possible to perform adequate gain control when there is an unnecessary wave in a frequency separated from the channel of the desired wave.

In this embodiment, the total gain reference value setting function 140 outputs a total gain reference value based on the pre-filtering signal power that was measured by the pre-filtering power measurement function 110, however, for example, in the case of improving the performance of the entire receiving apparatus 1, for which priority is placed on having the power of the desired frequency band be constant, the total gain reference value setting function 140 can output a total gain reference value based on the post-filtering signal power that is measured by the post-filtering power measurement function 120.

In this case, construction is such that the output from the post-filtering power measurement function 120 is inputted to the total gain reference value setting function 140. Alternatively, construction can be such that a switch is provided between the pre-filtering power measurement function 110 and post-filtering power measurement function 120 and the total gain reference value setting function 140 in order that the input to the total gain reference value setting function 140 can be switched.

In the case of construction in which the output from the post-filtering power measurement function 120 is inputted to the total gain reference value setting function 140, by performing operation such that reception power estimation function 160 is notified of the signal power that is measured by the pre-filtering power measurement function 110, for example, the reception power estimation function 160 can perform estimation of the reception power.

The target value that is used by the total gain reference value setting function 140 and the reference value that is used by the gain control function 150 can be a single value. However, in order to prevent degradation of the demodulation performance by minimizing the fluctuation in the total gain, preferably the target value and reference value are two separate values. In this case, it is possible to establish hysteresis by separating the value for determining whether the total gain is larger than the target value or reference value, and the value for determining whether the total gain is smaller than the target value or reference value.

The values (target value and reference value) that are used as threshold values in this embodiment change according to change in the reception band during reception, or change in the sampling frequency of the ADC 15, and in this case, the processing period is also changed in conjunction with this.

Embodiment 2

In the embodiment described above, by finding the power difference in a signal before and after filtering by a digital filter 16, the gain ratio was set according to the unnecessary power ratio, and gain control was performed, however, it is also possible to reflect the reception quality on the conditions for setting the gain ratio.

Figure 4:
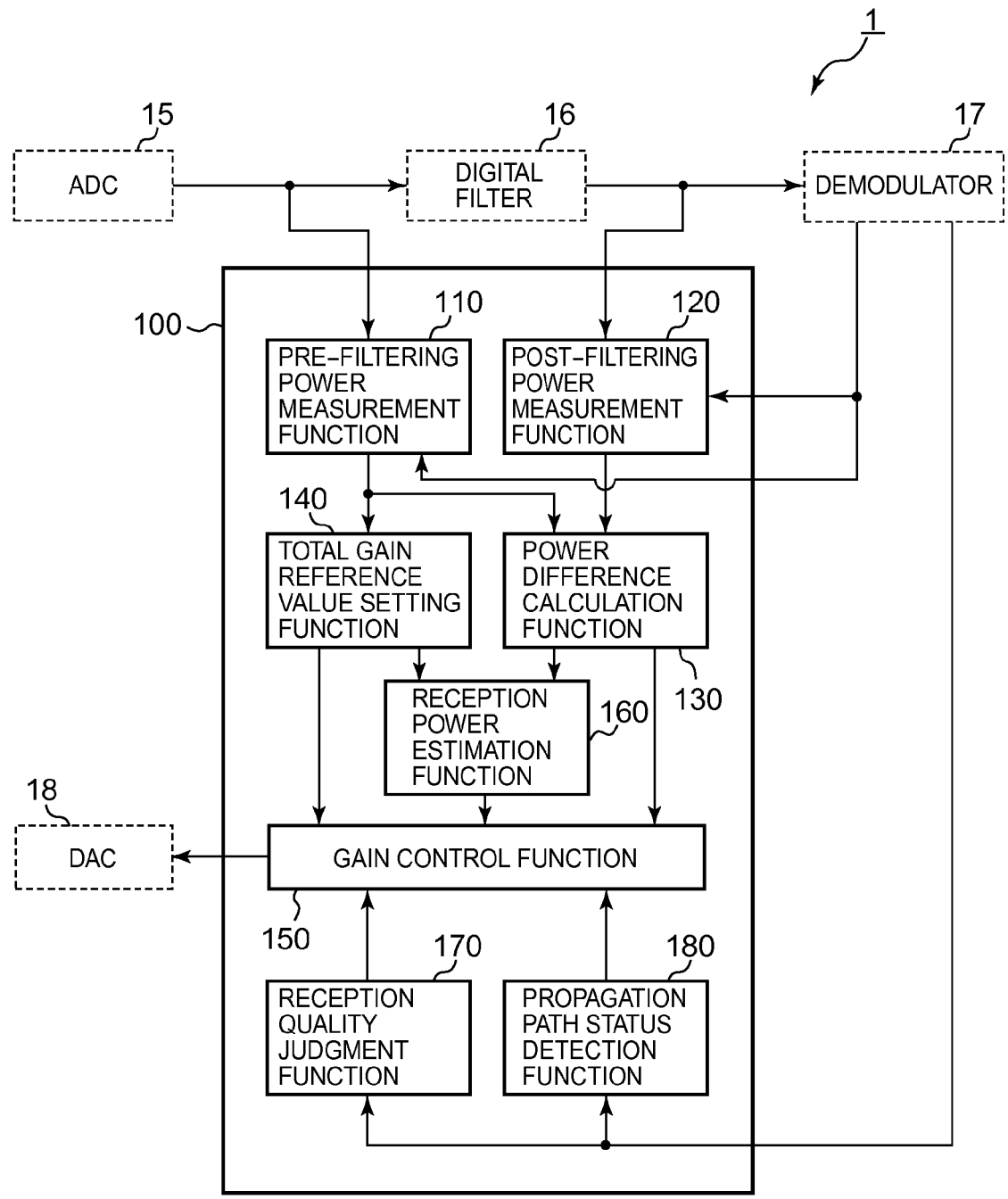
FIG. 4 is a block diagram of the functions achieved by the digital processing unit of a second embodiment of the present invention.

The function of a digital processing unit 100 for achieving this kind of operation is illustrated in FIG. 4. FIG. 4 is a function block diagram that illustrates the functions of this embodiment that are achieved by the digital processing unit 100.

As illustrated in FIG. 4, the digital processing unit 100 of this embodiment, in addition to each of the functions described in the first embodiment, has a reception quality judgment function 170 and a propagation path status detection function 180.

The reception quality judgment function 170, based on the demodulation results of the demodulator 17, generates a quality signal that indicates various kinds of quality related to a received signal, such as the received signal quality, line quality and the like, and notifies the gain control function 150.

Here, the received signal quality is the difference from the expectation value obtained from demodulation processing by the demodulator 17, and is expressed as error information, such as MER (Modulation Error Ratio), which indicates how much the received signal is separated from the closest coordinates expected by QPSK (Quadrate Phase Shift Keying) or QAM (Quadrate Amplitude Modulation).

The line quality, for example, is expressed by the signal error rate (Bit Error Ratio: BER) that is estimated from the difference between a signal that has been decoded by error-correction processing, and the original signal.

The reception quality judgment function 170 converts whether the received signal quality and line quality are good or bad to numerical values, gives a weighting to these values, generates a quality signal that indicates the combined value, and outputs the result to the gain control function 150.

The propagation path status detection function 180 detects the status of the propagation path based on the demodulation result from the demodulator 17, generates a status signal indicating the quality of the propagation path, and notifies the gain control function 150.

Here, the propagation path status, for example, is the arrival status of the propagation path that is found based on the strength of autocorrelation, which is performed when extracting time position information using OFDM having a guard interval (GI), the fluctuation in the reception level, an existing signal or the like.

The gain control function 150 controls the gain ratio of the RF amp 10 and IF amp 14 by performing an operation that is the same as the operation in the first embodiment. In this embodiment, however, the gain control function 150 adds several terms to conditions for setting the gain ratio (FIG. 3: step S103), not only the power difference, but also the reception power estimated by the reception power estimation function 160, the reception quality indicated by a quality signal that was generated by the reception quality judgment function 170, and the propagation path status indicated by status information that was generated by the propagation path status detection function 180.

The operation of the gain control function 150 in this case will be explained below. Here, the operation will be explained separately for the case in which the reception power is low, and the case in which the reception power is high.

First, when the reception power is low, the gain control function 150 compares the threshold value that is set when the reception power is low with the reception power estimated by the reception power estimation function 160, and when the reception power is less than the threshold value (in other words, when the reception power of the desired frequency band is low), generates a control signal for performing control so that the gain of the RF amp 10 does not decrease. This is because the NF degradation has more of an effect on reception than distortion occurring in the receiving apparatus 1 due to an unnecessary wave.

In this case, the gain control function 150 further compares the value outputted by the propagation path status detection function 180 with a threshold value (detection threshold value), and when the value indicated buy the status signal is greater than the detection threshold value (in other words, the amount of fluctuation of the propagation status is large), the weak power threshold value is increased. As a result, when the power of the desired frequency band is low, the gain control function 150 performs control so that it is difficult for the gain of the RF amp 10 to decrease. This is because when the fluctuation of the propagation path is large, the power is easily affected by the NF, and the desired wave instantaneously becomes small.

The gain control function 150 also compares the quality signal that is outputted by the reception quality judgment function 170 with a threshold value (quality threshold), and when the value that indicates the quality is higher than the quality threshold value, generates a control signal to perform control to lower the gain of the RF amp 10. This is because when there is good reception, the gain control function 150 does not need to perform gain control of the RF amp 10.

Next, the operation when the reception power is high is explained. In this case, the gain control function 150 compares the output value from the reception power estimation function 160 with a threshold value (strong power threshold value), and when the reception power is greater than the strong power threshold value (in other words, the reception power of the desired frequency band is high), generates a control signal to perform control so that the gain of the RF amp 10 is lowered. In a state in which the reception power is not greatly affected by the NF degradation, this is done in order to lower the gain of the RF amp 10 and increase the tolerance to unnecessary waves.

In this case, when the value indicated by the quality signal from the reception quality judgment function 170 is lower than the quality threshold value, and it is determined that the reception state is not good, the gain control function 150 lowers the value of the strong power threshold value. In doing so, the gain control function 150 performs control so that it is easier to lower the gain of the RF amp 10 when the power of the desired frequency band is high.

As described above, with the construction of this embodiment, the reception quality and the propagation path status are reflected on the conditions for setting the gain of the RF amp 10 and IF amp 14. As a result, in full-band reception, when there is an unnecessary wave in a frequency that is separated from the channel of the desired wave, it is possible to perform more adequate gain control according to the reception quality and the propagation path status.

In other words, when the reception power of the desired wave is low, it is necessary to make the NF the best, however, in this case, it is possible to perform control so that the gain ratio of the RF amp 10 is not lowered. When doing this, the value of the threshold value is changed based on the reception quality and propagation path status, so it is possible to establish a lower limit for the gain ratio of the RF amp 10 and to perform control so that the gain ratio does not become less than that limit.

On the other hand, when the reception power of the desired wave is high, degradation of the NF does not affect the quality of the received signal, so it is possible to actively perform control to lower the gain of the RF amp 10.

Moreover, when the reception power of the desired wave is low, fluctuation of the reception power is large (in other words, the fluctuation of the propagation path is large), and when there is a possibility that a sudden and temporary reduction in reception power will occur, it is possible to perform control to lower the gain ratio of the RF amp 10. As a result, because the gain ratio of the RF amp 10 is low, it is possible to prevent not being able to receive due to NF degradation when the reception power is reduced.

At this time, the threshold value is changed according to the reception quality and the propagation path status, so a lower limit can be established for the gain ratio of the RF amp 10, and thus it is possible to perform control so that the gain ratio does not become lower than that.

Each of the threshold values in this embodiment change in conjunction with changes in the reception performance such as the modulation method or encoding rate for reception, and by preparing two types of values for each such that there is hysteresis, it is possible to prevent reception degradation due to inadvertent gain changes in the RF amp 10.

Embodiment 3

In the first and second embodiment described above, examples of effective gain control were given for cases in full-band reception in which there is an unnecessary wave in a frequency separated from the channel of the desired wave, however, in this embodiment, an example of effective gain control is explained for a case in full-band reception in which there is an unnecessary wave in an unnecessary adjacent channel.

In other words, in full-band reception, when the gain of the RF amp 10 is too strong, an unnecessary component occurs in an unnecessary adjacent channel. When this happens, when the polarity of the IF frequency is not adequate, attenuation by a minus frequency becomes large, and it becomes easy for the reception characteristics to degrade. Therefore, in this embodiment, by performing a switching operation so that the polarity of the IF frequency becomes adequate, degradation of the reception characteristics due to gain control is prevented.

Figure 5:
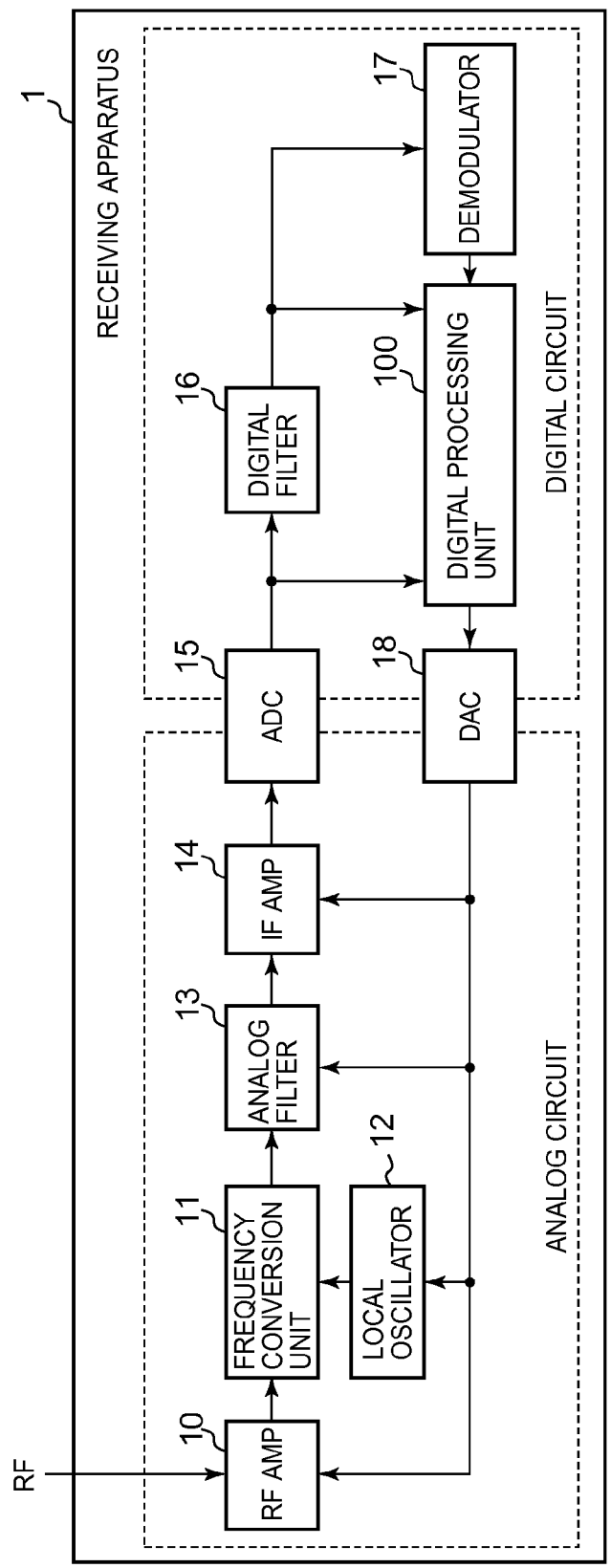
FIG. 5 is a block diagram illustrating the construction of a receiving apparatus of a third embodiment of the present invention.

FIG. 5 illustrates the construction of the receiving apparatus 1 of this embodiment that performs this kind of operation. As illustrated in FIG. 5, in this embodiment, construction is such that the digital processing unit 100 controls the local oscillator 12 and analog filter 13.

Based on a control signal from the digital processing unit 100, the local oscillator 12 in this case can change the frequency that is outputted to the frequency conversion unit 11. In this case, by changing the output frequency from the local oscillator 12, the polarity of the IF frequency that is outputted from the frequency conversion unit 11 is changed.

The analog filter 13 is a complex filter such as an LPF that, based on a control signal from the digital processing unit 100, is able to switch the polarity of the attenuation frequency, or in other words, the cancellation polarity, so that it corresponds to this kind of change in polarity of the IF frequency.

Figure 6:
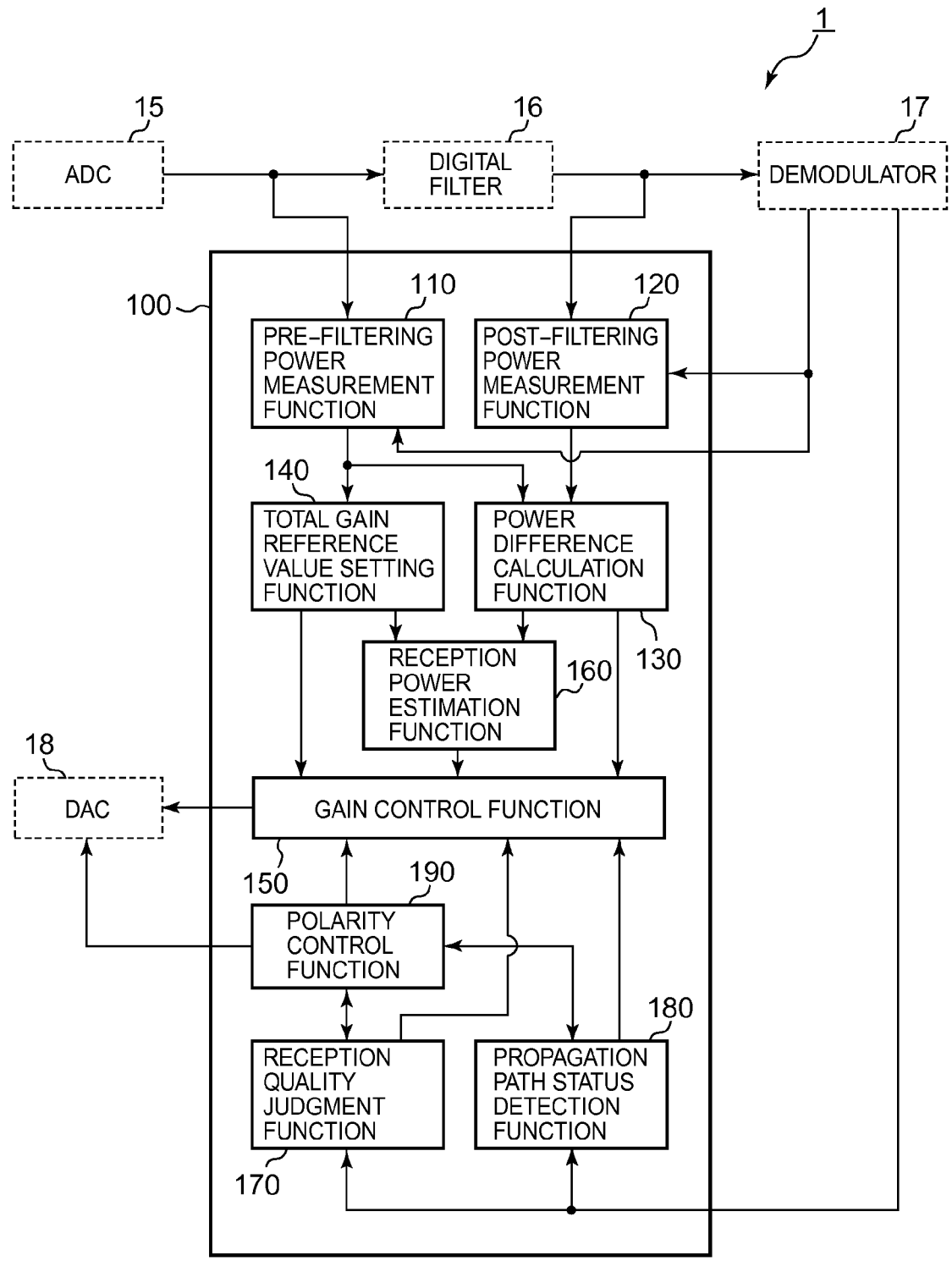
FIG. 6 is a block diagram of the functions achieved by the digital processing unit of a third embodiment of the present invention.

FIG. 6 illustrates examples of functions that are achieved by the digital processing unit 100 in this kind of construction. In this embodiment, as illustrated in FIG. 6, in addition to the pre-filtering power measurement function 110, post-filtering power measurement function 120, power difference calculation function 130, total gain reference value setting function 140, gain control function 150, reception power estimation function 160, reception quality judgment function 170 and propagation path status detection function 180 in the second embodiment above, the digital processing unit 100 has a polarity control function 190.

The polarity control function 190 generates a control signal for generating a local frequency that will switch the polarity of the IF frequency from the frequency conversion unit 11, and transmits that control signal to the local oscillator 12 via the DAC 18. Furthermore, the polarity control function 190 generates a control signal for switching the cancellation polarity according to the switched IF frequency polarity, and transmits that control signal to the analog filter 13 via the DAC 18.

Figure 7:
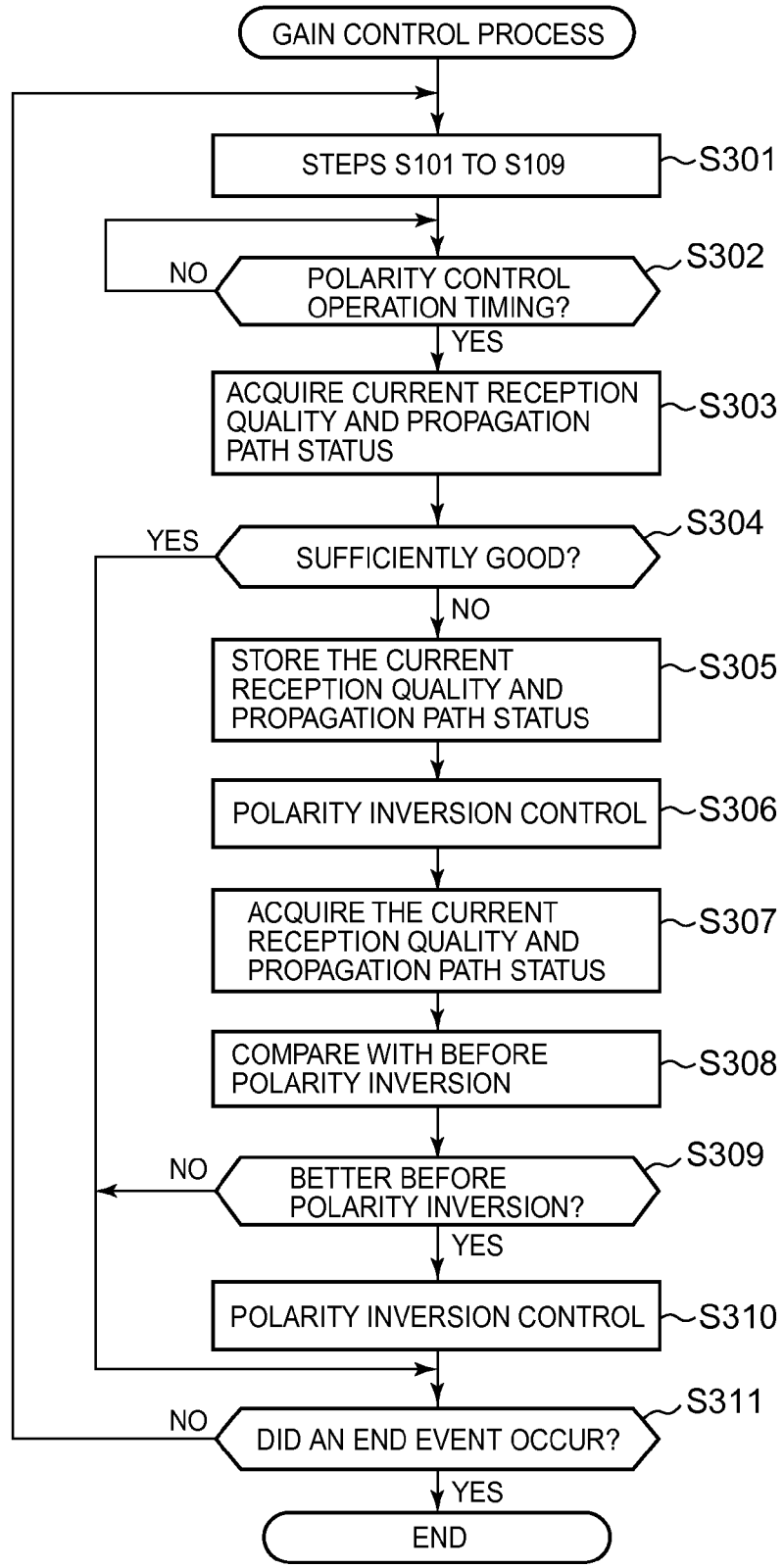
FIG. 7 is a flowchart for explaining the "gain control process" of a third embodiment of the present invention.

The operation of the receiving apparatus 1 of this embodiment is explained below. The "gain control process" of this embodiment will be explained with reference to the flowchart illustrated in FIG. 7. In the "gain control process" of this embodiment, as in the case of the "gain control process" of the first embodiment, the start of the reception operation by the receiving apparatus 1 triggers the start of processing.

After processing has started, control of the gain ratio is performed by the same processing as in step S101 to step S109 in the "gain control process" of the first embodiment (FIG. 3) (step S301).

Here, when setting the gain ratio in step S103, reception quality and propagation path status are added to the conditions as in the example of the second embodiment. In other words, the gain ratio can be optimized according to the reception quality and the propagation path status.

In the gain control in step S301, at the instant the control period of the RF amp 10 starts (step S107), the gain control function 150 notifies the polarity control function 190 of that.

This process ends when an end event occurs in step S301 (step S109: YES), however, when an end event does not occur (step S109: NO), the polarity control function 190, based on the notification from the gain control function 150, determines whether or not the operation timing for polarity control has been reached (step S302). In this embodiment, the polarity control function 190 performs the polarity switching operation of the frequency conversion unit 11 and analog filter 13 longer than the gain control period of the RF amp 10.

Therefore, at the instant when a specified time has elapsed after the notification of gain control of the RF amp 10, the polarity control function 190 can determine when the time has reached the operation timing for polarity control, however, until the time has reached this operation timing, processing waits without other operations being performed (step S302: NO). This is so that gain control is not performed during operation of the polarity control, and as a result, it is possible to prevent the oscillation or convergence from becoming bad due to improper feedback.

When the time reaches the operation time for polarity control (step S302: YES), the polarity control function 190 checks the reception quality and the propagation path status at that time by acquiring a quality signal and a status signal from the reception quality judgment function 170 and propagation path status detection function 180 (step S303).

Based on the acquired quality signal and status signal, the polarity control function 190 determines whether or not the current reception quality and propagation path status are sufficiently good (step S304). Here, for example, the polarity control function 190 compares the reception quality and propagation path status with respective threshold values that indicate that the reception quality and propagation path status are sufficiently good, and when both the reception quality and propagation path status are values that exceed the threshold values, the polarity control function 190 determines that they are "sufficiently good".

Here, when the current reception quality and the propagation status are sufficiently good (step S304, YES), there is no degradation of the reception performance due to the polarity selection, so the polarity control function 190 does not need to perform polarity switching. In this case, the polarity control function 190 advances to step S311 without performing polarity switching control.

On the other hand, when the current reception quality and propagation path status are not sufficiently good (step S304: NO), there is a possibility that degradation of the reception characteristics due to polarity selection has occurred. Therefore, the polarity control function 190 stores the quality signal and status signal that were acquired in step S303 in a memory device such as a register or RAM as information that indicates the reception quality and propagation path status before performing polarity switching (step S305).

Next, the polarity control function 190 generates a control signal that causes the local oscillator 12 to generate a local frequency that inverts the polarity of the IF frequency that is outputted by the frequency conversion unit 11, and generates a control signal that inverts the cancellation polarity of the analog filter 13, which is a complex filter, so that attenuation can be performed according to the inverted IF frequency polarity. The polarity control function 190 then performs control to invert the polarity of the IF frequency by transmitting the generated control signals to the local oscillator 12 and analog filter 13 via the DAC 18 (step S306).

After performing polarity inversion, the polarity control function 190 acquires a quality signal and status signal, which indicate the reception quality and propagation path status after polarity inversion, from the reception quality judgment function 170 and propagation path status detection function 180 (step S307).

The polarity control function 190 compares the acquired quality signal and status signal (in other words, the reception quality and propagation path status after polarity inversion) with the quality signal and status signal (in other words, the reception quality and propagation path status before polarity inversion) that were stored in step S305 (step S308).

Here, when the signals are better after polarity inversion (step S309: NO), the inverted polarity is suitable, so the polarity control function 190 maintains this state until the next polarity control timing.

On the other hand, when the signals before polarity inversion are better (step S309: YES), the polarity before inversion is suitable, so the polarity control function 190 once again inverts the polarity of the IF frequency by performing the same operation as in step S306 (step S310).

The receiving apparatus 1 repeatedly performs an operation as described above until an end event occurs (step S311: NO). In other words, for every period that is longer than the gain control period of the RF amp 10, the polarity control function 190 tries polarity inversion of the IF frequency, and the polarity having the best reception quality and propagation path status is selected.

This processing ends when an end event occurs (step S311: YES).

As described above, with the construction of this embodiment, by trying polarity inversion of the IF frequency after performing control of the gain ratio of the RF amp 10 and IF amp 14, polarity that results in a better reception state is selected. As a result, in full-band reception, when there is an unnecessary wave in an adjacent unnecessary channel, suitable frequency polarity is selected, and thus it is possible to further improve the effect of gain control.

As was described above, the total gain before and after switching the polarity is made to be the same by not performing gain control while polarity control is being performed, however, when the local frequency of the local oscillator 12 changes due to characteristic differences in analog circuits or the like, changes may also occur in the power measured by the pre-filtering power measurement function 110. In such a case, as was explained in the first embodiment, the gain of the IF amp 14 follows and converges by performing gain control of the IF amp 14 in a shorter period than the control period of the RF amp 10. However, in order to quicken this following, such an additional control may be performed that the gain control of the IF amp 14 is performed in a shorter period than the normal period, though such additional control may be performed only when it is immediately after the completion of the polarity control.

Embodiment 4

In the third embodiment above, a polarity that results in a better reception state is selected by trying polarity inversion of the IF frequency and comparing the reception quality and propagation path status before and after that inversion, however, this kind of operation can also be applied to gain control.

The construction of the receiving apparatus 1 in this case can be that applied in the example illustrated in the second embodiment, and the functions that are achieved by the digital processing unit 100 are as illustrated in FIG. 4.

The gain control function 150 temporarily changes (as a trial) the gain ratio of the RF amp 10 and IF amp 14 for every set period and compares the reception quality and propagation path status before and after the change. The gain control function 150 then sets the gain ratio that results in the better reception quality and propagation path status.

In this kind of gain ratio control as well, the gain control function 150 can perform an operation that, according to the reception quality and propagation path status, sets the gain ratio that corresponds to the size of the reception power, and changes the value of the threshold values that are used for setting the gain ratio, as in the example of the second embodiment.

The receiving apparatus 1 that performs the operation of this embodiment is suitable in the case of performing partial-band reception that receives only a desired frequency band that is included in a desired channel, such as in a one-segment broadcast.

In partial-band reception, everything except the desired frequency band in the desired channel is an unnecessary frequency component, so this unnecessary frequency component is also included in the desired channel. In this case, the power in a frequency having inverted polarity is the unnecessary frequency component from the same broadcast station, so the power ratio is only affected by the propagation path, and there is no large power difference.

Therefore, instead of performing gain ratio control based on the power difference as in the first embodiment to third embodiment, the gain ratio is periodically changed, and by changing to the better gain ratio based on the propagation path status before and after that change, a suitable gain ratio is obtained without performing any unnecessary gain control operation.

Embodiment 5

A receiving apparatus 1 that performs control by combining the operation of the third embodiment and the operation of the fourth embodiment is also possible. In other words, such a receiving apparatus 1 periodically changes the gain ratio of the RF amp 10 and IF amp 14, and sets the better gain ratio based on the reception quality before and after the change, and by performing a similar operation for polarity inversion of the IF frequency, selects the polarity having the better reception quality.

In this case, by making the period for changing the gain ratio a shorter period than the period for controlling the polarity selection, the polarity selection is performed after the gain ratio has been changed, and it is preferred that control be performed so that the change in the gain ratio and the selection of the polarity are not performed at the same time.

In this case as well, as in the example of the second embodiment, it is possible to perform an operation of setting the gain ratio according to the size of the reception power, and changing the value of the threshold values used in setting the gain ratio according to the reception quality and propagation path status.

In this embodiment, an operation of inverting the polarity is combined with the operation described in the fourth embodiment, so in partial-band reception such as in a one-segment broadcast, when there is an unnecessary frequency component in a frequency of the desired frequency band of which the polarity will be inverted, it is possible to obtain a better reception state by inverting the polarity, and thus it is possible to improve the effect of gain control.

As explained above, by applying the present invention as in the embodiments described above, it is possible to perform gain control of the receiving apparatus with a digital circuit, so the number of analog circuits can be reduced, making it possible to achieve a compact receiving apparatus at low cost.

In this case, it is possible to archive the suitable gain control without distortion occurring in the RF amp and the reduction of the number of analog circuits, since the gain ratio of the RF amp and IF amp is set according to the detection of the power difference, by a digital circuit, between the signal power that includes the frequency component other than the desired wave, and the signal power of the frequency component that has been filtered to the desired wave, from a signal that has been amplified by an IF amp and then converted to a digital signal.

The construction for detecting this kind of power difference is achieved by a digital circuit, so the reception power that corresponds to RSSI can be found through calculation, and even in the case of a receiving apparatus that is used in a system that uses RSSI, there is no need for construction for measuring the RSSI.

The operation for optimizing the polarity of the IF frequency is performed after controlling the gain ratio of the RF amp and the IF amp, so it is possible to cause the unnecessary component that occurs when the RF gain becomes excessive due to gain control to converge.

Furthermore, changing the gain ratio is periodically tried, and the gain ratio is controlled based on the reception quality that changes due to that, so it is possible to perform suitable gain control even in the case of partial-band reception in which it is difficult for the occurrence of an unnecessary component to be reflected in the power difference.

The construction for performing suitable control of this kind of partial-band reception, and the construction for performing suitable gain control in the case of full-band reception can logically be achieved by a digital circuit, so there is no need to prepare special circuits for each type of reception, and it is possible to obtain a receiving apparatus that is compact and low cost and that can flexibly perform gain control according to the type of reception.

The embodiments above are examples and do not limit the scope of the present invention. In other words, various applications are possible, and all embodiments are included within the scope of the present invention.

For example, in the embodiments above, conversion from an RF frequency to an IF frequency was performed by the frequency conversion unit 11, however, the frequency band after conversion could also be a Base Band (BB) frequency. In that case, instead of a LPF, the analog filter 13 can be constructed using a Band-Pass Filter (BPF); instead of an IFVGA, the IF amp 14 can be constructed using a Base Band VGA (BBVGA); and instead of a DLPF, the digital filter 16 can be constructed using a digital BPF (DBPF).

In the embodiments above, the demodulator 17 can be achieved by the digital processing unit 100. In other words, the functions achieved by the digital processing unit 100 described above and the functions for performing the operation of the demodulator 17 can be achieved by one digital circuit (processor).

The present invention can be achieved by a receiving apparatus that comprises beforehand the same functions and construction as the receiving apparatus 1 of the embodiments above, and as long as that receiving apparatus has a digital circuit to which signals before and after filtering are inputted, that receiving apparatus can be made to function as the receiving apparatus of the present invention by applying a program to the existing digital circuits of the receiving apparatus. In that case, by causing a computer (CPU or the like), which is the same as that of the digital processing unit 100 of the embodiments described above, execute a program for achieving the same functions as the functions described above, that receiving apparatus can be made to function as the receiving apparatus of the present invention.

The method for applying this kind of program is arbitrary, for example, besides storing the program in a memory medium such as a CD-ROM or memory card and applying that program, the program can be applied via a communication medium such as the Internet.

While the present invention has been described with reference to the preferred embodiments, it is intended that the invention not be limited by any of the details of the description therein, but includes all of the embodiments which fall within the scope of the appended claims.

What is claimed is:

1. A receiving apparatus comprising:
   a first amplifier that amplifies a received wave using high frequency;
   a frequency converter that performs frequency conversion on a signal output from the first amplifier from a frequency band of the first amplifier to a frequency band at a later stage;
   an analog filter that filters the signal that has been subjected to frequency conversion by the frequency converter;
   a second amplifier that amplifies the signal, which was filtered by the analog filter, using a demodulation frequency;
   a converter that converts the output signal from the second amplifier to a digital signal;
   a digital filter that filters the digital signal output from the converter to a desired frequency band;
   a demodulator that demodulates the digital signal that was filtered by the digital filter; and
   a digital circuit to which the digital signal output from the converter before being filtered by the digital filter and the digital signal that was output from the converter and then filtered by the digital filter are inputted;
   wherein the digital circuit comprises:
      a power difference calculation unit that calculates a power difference between the digital signal output from the converter before being filtered by the digital filter and the digital signal that was output from the converter and then filtered by the digital filter; and
      a gain control unit that, based on at least the power difference that was calculated by the power difference calculation unit, controls a gain ratio of the first amplifier and the second amplifier,
   wherein the gain control unit (i) compares a threshold value that indicates a settable gain ratio with the power difference; (ii) performs control so that, when the power difference is greater than the threshold value, the gain ratio of the first amplifier is lowered; and (iii) performs control so that, when the power difference is less than the threshold value, the gain ratio of the first amplifier is raised.

2. A receiving apparatus comprising:
   a first amplifier that amplifies a received wave using high frequency;
   a frequency converter that performs frequency conversion on a signal output from the first amplifier from a frequency band of the first amplifier to a frequency band at a later stage;
   an analog filter that filters the signal that has been subjected to frequency conversion by the frequency converter;
   a second amplifier that amplifies the signal, which was filtered by the analog filter, using a demodulation frequency;
   a converter that converts the output signal from the second amplifier to a digital signal;
   a digital filter that filters the digital signal output from the converter to a desired frequency band;
   a demodulator that demodulates the digital signal that was filtered by the digital filter; and
   a digital circuit to which the digital signal output from the converter before being filtered by the digital filter and the digital signal that was output from the converter and then filtered by the digital filter are inputted;
   wherein the digital circuit comprises:
      a power difference calculation unit that calculates a power difference between the digital signal output from the converter before being filtered by the digital filter and the digital signal that was output from the converter and then filtered by the digital filter; and
      a gain control unit that, based on at least the power difference that was calculated by the power difference calculation unit, controls a gain ratio of the first amplifier and the second amplifier,
   wherein the digital circuit further comprises a gain reference value setting unit that, based on a signal power of the digital signal output from the converter before being filtered by the digital filter, or a signal power of the digital signal that was output from the converter and then filtered by the digital filter, outputs a reference value for setting a total gain value of the first amplifier and the second amplifier;
      wherein the gain control unit sets the total gain value of the first amplifier and second amplifier based on the reference value, and sets the gain ratio based on the power difference and the total gain value.

3. The receiving apparatus according to claim 2, wherein the digital circuit further comprises:
   a reception power estimation unit that, based on the power difference and the reference value, estimates a power of a received signal in the desired frequency band;
   a quality judgment unit that, based on demodulation results of the demodulator, determines a quality of a received signal; and
   a status detection unit that, based on the demodulation results of the demodulator, detects a status of a propagation path;
   wherein the gain control unit sets the gain ratio based on an additional condition including at least one of the reception power, a judgment result of the quality judgment unit, and a detection result of the status detection unit.

4. The receiving apparatus according to claim 3, wherein the gain control unit performs control so that the gain ratio of the first amplifier is not lowered when the reception power is less than a specified threshold value, and performs control so that the gain ratio of the first amplifier is lowered when the reception power is greater than a specified threshold value.

5. The receiving apparatus according to claim 4, wherein the gain control unit changes the threshold value based on at least one of the judgment result of the quality judgment unit and the detection result of the status detection unit.

6. The receiving apparatus according to claim 3, wherein the gain control unit further comprises a polarity control unit that controls a polarity of the output frequency from the frequency converter and the analog filter based on at least one of the judgment result of the quality judgment unit and the detection result of the status detection unit.

7. A receiving apparatus comprising:
a first amplifier that amplifies a received wave using high frequency;
a frequency converter that performs frequency conversion on a signal output from the first amplifier from a frequency band of the first amplifier to a frequency band at a later stage;
an analog filter that filters the signal that has been subjected to frequency conversion by the frequency converter;
a second amplifier that amplifies the signal, which was filtered by the analog filter, using a demodulation frequency;
a converter that converts the output signal from the second amplifier to a digital signal;
a digital filter that filters the digital signal output from the converter to a desired frequency band;
a demodulator that demodulates the digital signal that was filtered by the digital filter; and
a digital circuit to which the digital signal output from the converter before being filtered by the digital filter and the digital signal that was output from the converter and then filtered by the digital filter are inputted;
wherein the digital circuit comprises:
 a power difference calculation unit that calculates a power difference between the digital signal output from the converter before being filtered by the digital filter and the digital signal that was output from the converter and then filtered by the digital filter; and
 a gain control unit that, based on at least the power difference that was calculated by the power difference calculation unit, controls a gain ratio of the first amplifier and the second amplifier,
wherein the gain control unit periodically performs control of the gain ratio, and performs control of the first amplifier for a longer period than control of the second amplifier.

8. A non-transitory computer readable memory medium on which a program is recorded that is executable by a computer, which controls a receiving apparatus, wherein the receiving apparatus comprises:
a first amplifier that amplifies a received wave using high frequency; a frequency converter that performs frequency conversion on a signal output from the first amplifier from a frequency band of the first amplifier to a frequency band at a later stage;
an analog filter that filters the signal that has been subjected to frequency conversion by the frequency converter;
a second amplifier that amplifies the signal, which was filtered by the analog filter, using a demodulation frequency; a converter that converts the output signal from the second amplifier to a digital signal;
a digital filter that filters the digital signal output from the converter to a desired frequency band; and
a demodulator that demodulates the digital signal that was filtered by the digital filter, and
wherein the program is executable by the computer to control the receiving apparatus to perform functions comprising:
calculating a power difference between the digital signal output from the converter before being filtered by the digital filter and the digital signal that was output from the converter and then filtered by the digital filter;
controlling a gain ratio of the first amplifier and the second amplifier based on at least the calculated power difference;
outputting a reference value for setting a total gain value of the first amplifier and the second amplifier based on a signal power of the digital signal output from the converter before being filtered by the digital filter, or a signal power of the digital signal that was output from the converter and then filtered by the digital filter;
setting the total gain value of the first amplifier and second amplifier based on the reference value;
estimating a power of a received signal in the desired frequency band based on the power difference and the reference value;
determining a quality of the received signal based on a demodulation result of the demodulator;
detecting a status of a propagation path based on the demodulation result of the demodulator;
setting the gain ratio based on an additional condition including at least one of the reception power, the quality of the received signal, and the status of the propagation path; and
controlling a polarity of the output frequency from the frequency converter and the analog filter based on at least one of the reception power, the quality of the received signal, and the status of the propagation path.

9. A receiving method for a receiving apparatus, the method comprising:
amplifying, with a first amplifier, a received wave using high frequency;
 performing, with a frequency converter, frequency conversion on a signal output from the first amplifier from a frequency band of the first amplifier to a frequency band at a later stage;
 filtering, with an analog filter, the signal that has been subjected to frequency conversion by the frequency converter;
 amplifying, with a second amplifier, the signal which was filtered by the analog filter, using a demodulation frequency;
 converting, with a converter, the output signal from the second amplifier to a digital signal;
 filtering, with a digital filter, the digital signal output from the converter to a desired frequency band;
 demodulating, with a demodulator, the digital signal that was filtered by the digital filter;
 calculating a power difference between the digital signal output from the converter before being filtered by the digital filter and the digital signal that was output from the converter and then filtered by the digital filter;
 controlling a gain ratio of the first amplifier and the second amplifier, based on at least the calculated power difference;
 outputting a reference value for setting a total gain value of the first amplifier and the second amplifier based on a signal power of the digital signal output from the converter before being filtered by the digital filter, or a signal power of the digital signal that was output from the converter and then filtered by the digital filter;
 setting the total gain value of the first amplifier and second amplifier based on the reference value;
 estimating a power of a received signal in the desired frequency band based on the power difference and the reference value;

determining a quality of the received signal based on a demodulation result of the demodulator;

detecting a status of a propagation path based on the demodulation result of the demodulator;

setting the gain ratio based on an additional condition including at least one of the reception power, the quality of the received signal, and the status of the propagation path; and controlling a polarity of the output frequency from the frequency converter and the analog filter based on at least one of the reception power, the quality of the received signal, and the status of the propagation path.

10. A receiving apparatus comprising:

a first amplifier that amplifies a received wave using high frequency;

a frequency converter that performs frequency conversion on a signal output from the first amplifier from a frequency band of the first amplifier to a frequency band at a later stage;

an analog filter that filters the signal that has been subjected to frequency conversion by the frequency converter;

a second amplifier that amplifies the signal, which was filtered by the analog filter, using a demodulation frequency;

a converter that converts the output signal from the second amplifier to a digital signal;

a digital filter that filters the digital signal output from the converter to a desired frequency band;

a demodulator that demodulates the digital signal that was filtered by the digital filter; and a digital circuit to which the digital signal output from the converter before being filtered by the digital filter and the digital signal that was output from the converter and then filtered by the digital filter are inputted;

wherein the digital circuit comprises:

a gain control unit that controls a gain ratio of the first amplifier and the second amplifier;

a quality judgment unit that, based on demodulation results of the demodulator, determines a quality of a received signal; and a status detection unit that, based on the demodulation results of the demodulator, detects a status of a propagation path;

wherein the gain control unit temporarily changes the gain ratio, and sets the gain ratio based on at least one of a judgment result of the quality judgment unit and a detection result of the status detection unit before and after changing the gain ratio.

* * * * *